(12) United States Patent
Obweger et al.

(10) Patent No.: US 8,435,356 B2
(45) Date of Patent: May 7, 2013

(54) DEVICE AND METHOD FOR WET TREATING DISC-LIKE SUBSTRATES

(75) Inventors: Rainer Obweger, Lind im Drautal (AT); Alexander Pfeuffer, Villach (AT); Martin Köffler, Weissenstein (AT); Alexander Lippert, Gödersdorf (AT)

(73) Assignee: Lam Research AG, Villach (AT)

( * ) Notice: Subject to any disclaimer, the term of this patent is extended or adjusted under 35 U.S.C. 154(b) by 0 days.

(21) Appl. No.: 13/415,229

(22) Filed: Mar. 8, 2012

(65) Prior Publication Data

US 2012/0167914 A1 Jul. 5, 2012

Related U.S. Application Data

(62) Division of application No. 10/560,812, filed as application No. PCT/EP2004/051159 on Jun. 17, 2004, now Pat. No. 8,261,757.

(30) Foreign Application Priority Data

Jun. 24, 2003 (AT) .................................. A 970/2003

(51) Int. Cl.
*B08B 3/12* (2006.01)
(52) U.S. Cl.
USPC .......................................... 134/1; 134/2; 15/1
(58) Field of Classification Search .................. None
See application file for complete search history.

(56) References Cited

U.S. PATENT DOCUMENTS

| 4,401,131 A | 8/1983 | Lawson |
| 5,762,708 A | 6/1998 | Motoda |
| 5,788,453 A | 8/1998 | Donde |
| 5,979,475 A | 11/1999 | Hitoshi |
| 6,021,785 A | 2/2000 | Grutzediek |
| 6,532,977 B2 | 3/2003 | Otsuki |
| 6,632,292 B1 | 10/2003 | Aegerter |
| 2002/0050244 A1 | 5/2002 | Engesser |
| 2002/0162570 A1 | 11/2002 | Cavazza |
| 2004/0132318 A1 | 7/2004 | Kim |

FOREIGN PATENT DOCUMENTS

| DE | 19629705 | 1/1998 |
| JP | 07-171526 | 7/1995 |
| JP | 08-130202 | 5/1996 |
| JP | 10-154677 | 6/1998 |
| JP | 10-163153 | 6/1998 |
| JP | 10-192799 | 7/1998 |
| JP | 2000-21840 | 1/2000 |

*Primary Examiner* — Eric Golightly
(74) *Attorney, Agent, or Firm* — Young & Thompson (57) ABSTRACT

A method for wet treatment of wafers includes a first plate and a second plate substantially parallel to the first plate, and a wafer is held between the first and the second plate substantially parallel. A first dispenser introduces fluid into a first gap between the first plate and the wafer when being treated, and a second dispenser introduces fluid into a second gap between the second plate and the wafer when being treated. At least one vibrating element is acoustically coupled to at least the second plate, and a holder and the second plate are rotated relative to each other about an axis substantially perpendicular to the second plate.

8 Claims, 5 Drawing Sheets

DEVICE AND METHOD FOR WET TREATING DISC-LIKE SUBSTRATES

CROSS REFERENCE TO RELATED APPLICATIONS

This application is a division of application Ser. No. 10/560,812 filed on Dec. 15, 2005 and issued as U.S. Patent 8,261,757 on Sep. 11, 2012; which is the 35 U.S.C. 371 national stage of International application PCT/EP04/51159 filed on Jun. 17, 2004; which claims priority to Austrian application A970/2003 filed on Jun. 24, 2003. The entire contents of each of the above-identified applications are hereby incorporated by reference.

TECHNICAL FIELD

The invention relates to a device and a method for wet treating a flat disc-like substrate, such as semiconductor wafers, flat panel displays or compact discs. If in the following the term wafer is used such disk-like substrates are meant. More specifically the invention relates to a device for wet treatment utilizing ultrasonic wave energy. Whenever herein the term ultrasonic is used it shall be understood that megasonic is included herein as being a specific form of ultrasonic i.e. above 1 MHz.

BACKGROUND ART

U.S. Pat. No. 4,401,131 A1 discloses a wafer-cleaning device, wherein the wafer is held by a vacuum spin chuck and rotated. Simultaneously cleaning liquid is supplied between a transducer-plate and the wafer. The transducer plate is agitated by piezo elements. Liquid is supplied between the wafer and the transducer through a central opening in the transducer plate. Ultrasonic is supplied across the whole wafer. This device has the disadvantage that only one side of the wafer can be treated at one time and the other side is mechanically touched by the spin chuck.

U.S. Pat. No. 5,979,475 A1 discloses a wafer-cleaning device comprising two parallel plates optionally having an ultrasonic vibrator for treating both sides of a wafer sandwiched therebetween. The wafer floats on liquid cushions generated by liquid introduced through central openings of each plate. The wafer is not held by any further element and is therefore allowed to rotate freely. This device has the disadvantage that the wafer floating sandwiched between two plates is very hard to control and therefore most of the time a very instable system.

An object of the invention is to simultaneously treat a wafer with liquid on both sides with a device, which is easy to control in order to achieve stable treating conditions.

Another object of the invention is to apply ultrasonic wave energy to a wafer for sufficient cleaning but however avoiding to high local ultrasonic energy.

Yet another object of the invention is to treat a wafer with a very low amount of liquid because of environmental and cost reduction purposes.

DISCLOSURE OF THE INVENTION

The invention meets the objects by providing a device for wet treating a flat plate-like substrate comprising:
 a first plate
 a second plate substantially parallel to said first plate
 holding means for holding a wafer between said first and said second plate substantially parallel to said plates.
 first dispensing means for introducing fluid into a first gap between said first plate and a wafer when being treated
 second dispensing means for introducing fluid into a second gap between said second plate and a wafer when being treated
 at least one vibrating element acoustically coupled to at least said second plate
 rotating means for rotating said holding means and said second plate relative to each other about an axis substantially perpendicular to said second plate.

First and second plate may be made of polymer material such as poly tetra fluor ethylene (e.g. Teflon™), metal with coated surfaces or any other material inert to the treating fluids used or with an appropriate coating. A plate may have the shape of any kind of body, which has a flat surface serving as a plate. Such bodies may be a cone, a frustum, a cylinder, a circular disk or similar.

The at least one vibrating element may be a piezoelectric transducer. Such piezoelectric transducers shall be bonded to a reasonable resonator typically made of rigid material like quartz, stainless steel, aluminum, glass or sapphire. If the plate's material is not a rigid material the resonator could be coupled to the plate through an intermediate medium like water.

An advantage of the invention is that the second plate with the attached vibrating elements is brought in close proximity to a wafer to be treated, whereby ultrasonic sound energy can precisely be applied to the wafer.

At the same time the first plate can absorb ultrasonic energy, which has passed through the wafer. Consequently undesired interferences occurring from primary ultrasonic waves interfering with reflected ultrasonic waves can be avoided. In order to enhance such an ultrasonic energy-drain damping elements can be attached to first plate.

Another advantage of the invention is that the wafer is moved in the field of ultrasonic wave energy, which leads to equalizing the ultrasonic waves applied to the wafer.

Although not necessary in an advantageous embodiment said plates are substantially horizontally arranged, which leads to the advantage that the wafer can easier be brought into the device.

In another embodiment means are provided for rotating at least one of said two plates. Such means may be able to rotate the first or the second plate.

In the case said means are for rotating the first plate they may be simultaneously the means for rotating said holding means and said second plate relative to each other about an axis substantially perpendicular to said second plate when the holding means are attached to the first plate. In this case holding means are rotatable together with the rotatable plate.

In the case said means are for rotating the second plate they may be simultaneously the means for rotating said holding means and said second plate relative to each other about an axis substantially perpendicular to said second plate when the holding means are not attached to the second plate. In this case holding means are not rotatable together with the rotatable plate.

To couple holding means and first plate to each other to form a holding unit brings the advantage that the mechanics for the holding means can be housed in the first plate.

If holding means comprise gripping means for securely gripping a wafer the wafer is not only held by friction force.

The second plate not being rotatable brings the advantage that the plate carrying the vibrating element does not need to be rotated, which is positive with respect to the electronics typically attached or connected to vibrating elements such as piezoelectric transducers.

Another embodiment further comprises a liquid collector, which is circumferentially surrounding said holding means for collecting liquid that flows off a wafer during being treated with liquid. Such a liquid collector is also called cup or splashguard.

In one embodiment second plate is sealed against said liquid collector, which protects the vibrating elements and their electronics from being wetted. This could also be achieved by permanently welding the second plate to the liquid collector or forming both parts out of one body keeping them together.

Device might further comprise means for varying distance from the first plate to the second plate to insert a wafer to the space defined between said two plates and to withdraw a wafer therefrom. Such means for varying distance may be e.g. hydraulic, pneumatic, or electromechanical elements (e.g. belt drive, ball spindle).

In a preferred embodiment first spacer means are provided for keeping the first plate and the holding means in certain distance during treating the wafer to form a gap between the wafer and the first plate of 0.1 mm to 10 mm preferably 0.5 mm to 5 mm during treating the wafer. Such first spacer means can be gripping pins. Providing a small gap gives the advantage that only a very small amount of liquid is needed for treating the wafer.

In a preferred embodiment second spacer means are provided for keeping the second plate and the holding means in certain distance during treating the wafer to form a gap between the wafer and the second plate of 0.1 mm to 10 mm preferably 0.5 mm to 5 mm during treating the wafer. Such second spacer means can simultaneously be means for varying distance from the first plate to the second plate.

In another embodiment at least one of said at least one vibrating element is arranged with respect to the surface of the second plate facing the wafer so that ultrasonic waves are substantially directed to the wafer when treated taking an angle $\alpha'$ of 85° to 60° to the plane provided for the wafer.

This can be achieved for instance if at least one of said at least one vibrating element is arranged in a slanted plane taking an angle $\alpha$ of 5 to 30° to the plane provided for the wafer. Alternatively a plate carrying vibrating elements has a surface facing the wafer comprising at least one section of a slanted plane. This could be carried out with a plate having a surface (facing the wafer) similar to a flapped disc or a conical surface with the distance to the plane provided for the wafer in the center of the plate being higher than at the edge of the plate.

The angle $\alpha$ of 5 to 30° gives the advantage that a specific desired amount of cavitations occur, which further enhances the cleaning efficiency. It is know in the art that at an angle of 28° at a frequency of 950 MHz a 200 mm silicon wafer is transparent to ultrasonic waves (Further details about this effect of the angle are taught by A. Tomozawa "The Visual Observation and the Simulation of Ultrasonic Transmission through Silicon in Mega-sonic Single Wafer Cleaning System" presented at Hawaii conference of the Electrochemical Society (ECS) in 1999). Treating a wafer with ultrasonic energy at a state when the wafer is transparent to ultrasonic waves is advantageous because it opens the possibility to clean both sides of the wafer with only applying ultrasonic energy to one side of the wafer. Furthermore this helps to avoid the occurrence of a standing wave, which could lead to damages to a semiconductor material when being treated with ultrasonic waves (details are taught in US2003/0024547A1).

If ultrasonic waves are coupled through a first medium to the main surface of a plate with parallel main planes it shall be taken into consideration that total reflection has to be avoided.

If said first medium is water and the plate is made of aluminum the angle of the vibrating elements being slated to the plane shall not be more than 14°.

Additional gas dispenser for at least one of said first and second gap can be provided for displacing liquid from the respective gap to dry the wafer immediately after wet treating. Gas dispenser for both said first and said second plate may be provided.

When an opening in at least one of said first and second plate does not include the rotational center liquid will be vertically move over the rotational center between the plate and the wafer. This avoids a possible zone of dead volume.

If at least one vibrating element is arranged to cover the area of the rotational axis the whole area of the wafer surface can be reached by ultrasonic waves.

Another embodiment further comprises means for opening and closing holding elements of said holding means during treatment of the wafer. This can be achieved if the tooth gear, which drives the eccentrically movable pins, is agitated through a servomotor or each pin is driven through a magnetic or piezoelectric switch.

Advantageously at least one plate at least partly comprises material having a specific sound-propagation velocity deferring not more to the specific sound-propagation velocity of water than 20%. This decreases the amount of ultrasonic waves being reflected at the surface boundary from the plate into the liquid.

A further aspect of the invention is a method for wet treating a single wafer. Such a method comprises the following features:

holding a single wafer in a plane B. Plane B is defined as the symmetrical plane of the wafer being parallel to the wafer's main surfaces.

providing a first plate having a plane A facing the wafer thereby creating a first gap of a distance d1 providing a second plate having a plane C facing the wafer thereby creating a second gap of a distance d2 inserting a first liquid into said first gap thereby substantially completely filling said first gap inserting a second liquid into said second gap thereby substantially completely filling said second gap applying ultrasonic energy to said second plate while less than 10% of the ultrasonic energy applied to said second plate is applied to said first plate.

relatively rotating wafer and second plate against each other about a rotation axis substantially perpendicular to the wafer's main surfaces.

The advantage of this method is draining and absorbing ultrasonic energy and avoiding reflection of ultrasonic waves on a boundary layer and thus avoiding undesired interferences of primary ultrasonic waves and reflected (secondary) ultrasonic waves.

In one embodiment a wafer is rotating, which leads to additional shear rate between the wafer and the adjacent plate, which enhances cleaning efficiency. However, alternatively said second plate may rotate.

During term of processing substantially the second plate may at least temporarily cover all parts of one wafer side.

Advantageously said second liquid is inserted into said second gap through an opening offset to the rotation axis.

Yet another aspect of the invention is a device for wet treatment of wafers comprising a first plate holding means for holding a wafer in a certain distance substantially parallel to said first plate.

first dispensing means for introducing fluid into a first gap between said first plate and a wafer when being treated at least one vibrating element acoustically coupled to said first plate rotating means for rotating said holding means and said first plate relative to each other about an axis substantially perpendicular to said second plate.

adjustment-elements are provided in order to direct ultrasonic waves at an angle α' of less than 89° (advantageously less than 85°) to a wafer when treated.

If ultrasonic waves are directed to a wafer at an angle α' of less than 89° the occurrence of a standing wave can be avoided. This effect is enhanced if angle α' is less than 85°.

In the invented device the adjustment-elements may comprise a slanted plane or slanted planes wherein at least one of said at least one transducers is placed.

In an advantageous embodiment said at least one transducer, which is placed in a slanted plane, is acoustically coupled to an intermediate liquid chamber, said intermediate liquid chamber is further acoustically coupled to said first plate. The liquid in the chamber may be separated from the liquid, with which the wafer shall be treated, through a membrane. Such a membrane may be made of plastic (e.g. poly tetra fluor ethene) a metal (e.g. stainless steel) or any other material able to transmit ultrasonic energy.

If said intermediate liquid chamber is connected to a liquid circuit it is possible to permanently renew liquid in the chamber, which allows to cool the intermediate liquid chamber. This avoids excess heat addition to the wafer.

In another embodiment such adjustment-elements comprise an array of a plurality of transducers with at least one ultrasonic generator to separately agitate said plurality of transducers in a phase-shifted way in order to generate an ultrasonic wave directed from said array of transducers at an angle α' of less than 89° (advantageously less than 85°). This means that the wave front is slanted by an angle α of more than 1° (advantageously more than 5°). Preferably wave front is slanted by an angle α of 20° to 45°—more preferably 25° to 40°.

If such adjustment-elements comprise an array of a plurality of transducers such array may be arranged parallel to the plane provided for the wafer when treated.

In a preferred embodiment said array of transducers is a two dimensionally arranged plurality of transducers (e.g. minimum 5 by 5).

Good performance can be achieved if the quotient of the distance a of the first plate to the wafer surface facing said first plate and the mean distance d between the centers of two adjacent transducers of the array is greater than 5 (a/d>5).

It is preferred if the quotient of the desired ultrasonic wave length 1 and the mean distance d between the centers of two adjacent transducers of the array is greater than 1 (1/d>1). In other words—the mean distance d of the centers of adjacent transducers of the array is preferably not greater than the wavelength (1>d). Advantageously distance d is not greater than half of the desired wavelength 1. If the transducer and ultrasonic generator is designed for a specific wavelength 1 MHz (=$10^6$ 1/s) and the device for wet treatment is configured for aqueous solutions with an sound-propagation velocity of 1500 m/s the desired wavelength is 1.5 mm. An advantageous mean distance d is below 2 mm, preferably below 0.5 mm.

In a preferred embodiment the width D of the array of transducers is at least three times as big as the distance d1 of the first plate to the wafer surface facing said first plate (D≧3*d1).

An advantageous device comprises a second plate substantially parallel to said first plate with second dispensing means for introducing fluid into a second gap between said second plate and a wafer when being treated. This provides the possibility to simultaneously clean both sides of a wafer.

Another aspect of the invention is a method for wet treating a single wafer comprising holding a single wafer in a plane B providing a first plate having a plane A facing the wafer thereby creating a first gap of a distance d1 inserting a first liquid into said first gap thereby substantially completely filling said first gap applying ultrasonic energy to said first plate so that ultrasonic energy is applied to said plane B in an angle α of less than 89° (advantageously less than 85°).

relatively moving wafer and first plate against each other along a direction substantially parallel to the wafer's main surfaces.

In a preferred method said relative movement of wafer and first plate against each other along a direction substantially parallel to the wafer's main surfaces is carried out by relatively rotating wafer and second plate against each other about a rotation axis substantially perpendicular to the wafer's main surfaces.

Another method for wet treating a single wafer further comprises providing a second plate having a plane C facing the wafer thereby creating a second gap of a distance d2 inserting a second liquid into said second gap thereby substantially completely filling said second gap Preferably during term of processing substantially all parts of one wafer side are at least temporarily covered by the second plate.

Method according to claim 33 wherein said ultrasonic energy applied to said first plate so that ultrasonic energy is applied to said plane B in an angle α' of less than 89° (advantageously less than 85°) is generated by an array of a plurality of transducers with at least one ultrasonic generator to separately agitate said plurality of transducers in a phase-shifted way in order to generate an ultrasonic wave directed from said array of transducers at an angle α' of less than 89° (advantageously less than 85°).

In a preferred method is angle α' varied during the wafer being treated with liquid. In this case either the transducers may be moved by e.g. servo motors or if an array of a plurality of transducers the phase shift is altered.

Further details and advantages of the invention can be realized from the detailed description of a preferred embodiment.

BEST MODE FOR CARRYING OUT THE INVENTION

Figure 1:
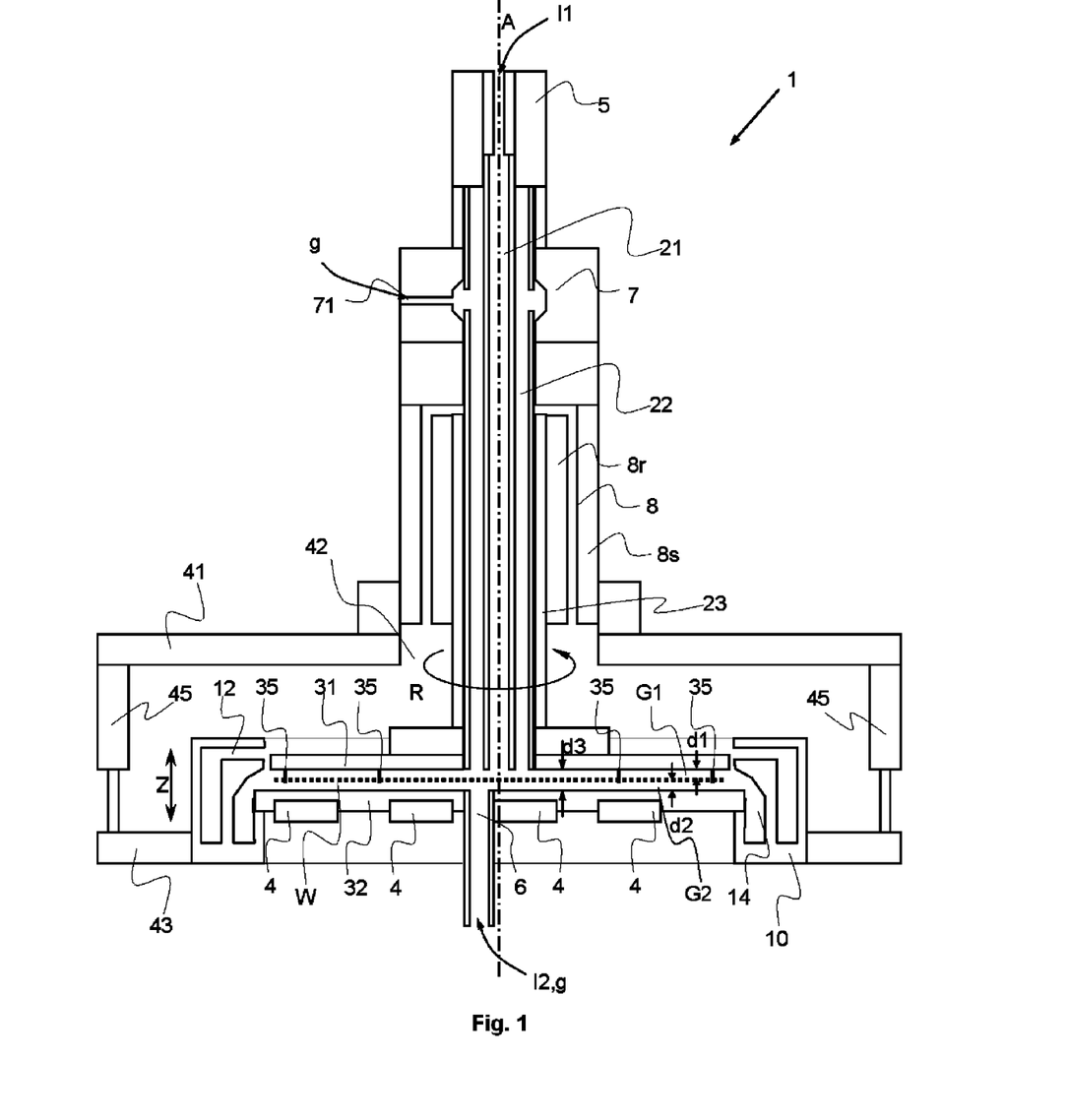
FIG. 1 shows a schematic cross section of a first embodiment of the invention during wet treating a wafer.

FIG. 1 shows a wet treatment device 1 according to the present invention. On a horizontal mounting plate 41 with a central opening 42 a hollow shaft motor 8 with a vertical rotation axis A is mounted. The hollow shaft motor comprises a stator 8s, a rotor 8r and a hollow rotating shaft 23 fixed to said rotor 8r.

The lower end of the hollow shaft 23 projects through the central opening of the first mounting plate 41 and is connected to a first plate 31 perpendicular to said hollow shaft 23. Said first plate 31 has the shape of a circular disk and the central axis A of the hollow shaft 23 goes through the center of the plate 31. The first plate 31 is part of a gripping device (spin chuck), which further comprises eccentrically movable gripping pins 35. Such pins 35 are eccentrically moved through a tooth gear (not shown) e.g. as described in U.S. Pat. No. 4,903,717, which is hereby incorporated by reference. Alternative pin movement mechanisms are disclosed e.g. in U.S. Pat. No. 5,788,453, which is hereby incorporated by reference or U.S. Pat. No. 5,156,174, which is hereby incorporated by reference. The show embodiment comprises six pins. Alternatively only three pins can be used of which only one pin is eccentrically movable for securely chucking the wafer. If other gripping (clamping) elements are used the number can be reduced to two with one moving element. The first plate 31 is facing downward thus the pins 35 are projecting downwardly for holding the wafer W underneath the first plate 31. If the pins can be opened during rotating the gripping device (e.g. the tooth gear is agitated through a servo motor or each pin through a magnetic switch) the wafer is allowed to freely float between two fluid cushions.

A second plate 32 is provided below and substantially parallel to said first plate 31. The second plate 32 has the shape of a circular disk and the central axis A of the hollow shaft 23 goes through the center of the second plate 32. Said second plate 32 is circumferentially surrounded by an annular liquid collector 10, which may also be called cup bowl or splashguard respectively. The second plate 32 is sealed against the liquid collector with an O-ring seal (not shown) or the second plate 32 is part of the liquid collector. The liquid collector comprises an annular duct 14 for collecting liquid, which is flung of the wafer during wet treatment and the liquid is drained through an opening (not shown) near the bottom of the annular duct 14. The liquid collector further comprises an annular gas suction nozzle 12 directed inwardly above the annular duct 14 for receiving ambient gas and mist deriving from wet treatment. The inner diameter of the upper part of the liquid collector 10 is only somewhat larger than the outer diameter of the first plate 31 so that the first plate can be inserted into the liquid collector leaving a circumferential gap of 0.2-5.0 mm. The gap shall be small enough to seal the wafer against the ambient during treatment but big enough to avoid friction between the first plate 31 and the liquid collector 10 during the first plate being rotated.

The liquid collector 10 is connected to a second mounting plate 43. The second mounting plate 43 is connected to the first mounting plate 41 via lifting means 45. The lifting means are for altering vertical position of the two mounting plates 41 and 43 towards each other. If the second mounting plate 43 is connected to the machine frame (not shown) the lifting means 45 are able to lift and lower the first mounting plate 41 together with the spin chuck comprising the gripping means 35 and the first plate 31. If the first mounting plate 41 is connected to the machine frame the lifting means 45 are able to lift and lower the second mounting plate 43 together with the liquid collector 10 and the second plate 32. The vertical movement is indicated by arrow Z.

A plurality of ultrasonic vibrating elements 4 are attached to the second plate 32 on the side being opposite to the first plate 31 thus being acoustically coupled to the second plate 32. The vibrating elements 4 are arranged in a way to substantially totally cover the whole diameter of the part of the second plate 32 which covers the wafer during wet treatment or vibrating elements 4 are spread all over the second plate. The vibrating elements 4 may be piezoelectric transducers.

Eccentrically to the rotational axis A, about which the first plate 31 is rotatable, a lower dispenser 6 is attached to second plate 32 and opens to the room between first and second plate 31, 32. The lower dispenser 6 is configured to dispense either liquid or gas towards the lower side of a wafer W to fully fill the gap G2 between the second plate and the wafer W, this couples the ultrasonic waves generated by vibrating elements 4 to the wafer W. The opening of the lower dispenser 6 is set off the rotational axis A to enable a vibrating element being arranged in close proximity to the wafers center. Thus all areas of the wafer may be reached by ultrasonic waves. The lower dispenser 6 is connected to a multi port valve (not shown), which is further connected to at least one liquid source and to at least one gas source. Therefore different liquids (cleaning agents) and different gases (e.g. nitrogen) may be selectively applied. The multi port valve may be a cascade of single solenoid valves.

The upper dispense system comprises two coaxially arranged tubes 21 and 22 leading through the hollow shaft 23 attached to first plate 31 and opening to the room between first and second plate 31, 32. The inner tube 21 is for dispensing liquid and the space between inner tube 21 and outer tube 22 is for dispensing gas. Both tubes 21, 22 are rotatable together with the hollow shaft 23. To introduce liquid to the inner tube 21 a liquid rotary connection 5 is provided. Gas is feed in the space between the tubes 21 and 22 through a gas rotary connection 7.

Alternatively the device shown in FIG. 1 may of course be arranged up side down so that the first plate becomes the lower plate and the second plate the upper plate.

Figure 2:
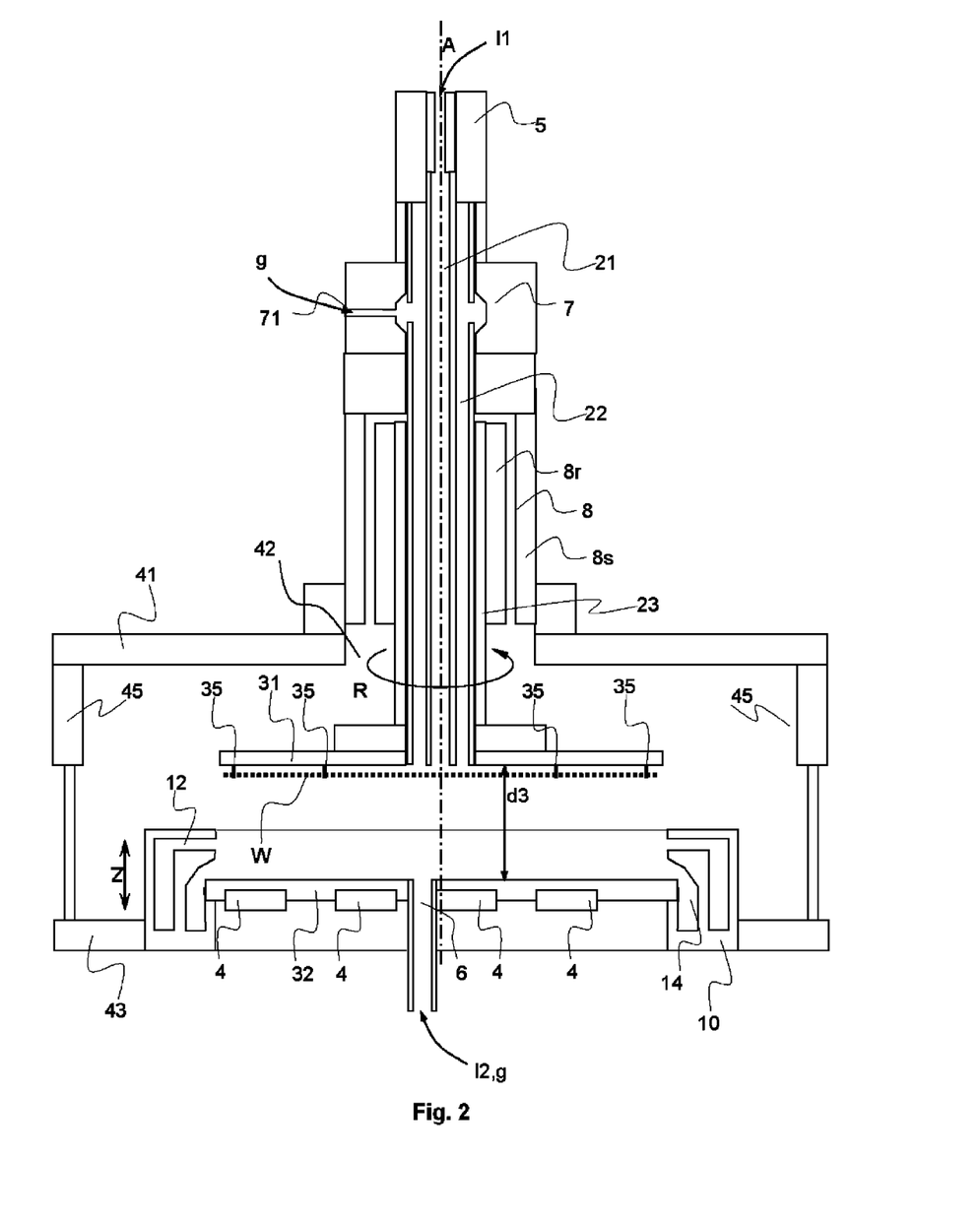
FIG. 2 shows a schematic cross section of a first embodiment of the invention in an open state for loading a wafer.

FIG. 2 shows the first embodiment of the invention in an open state.

The device according to the first embodiment can be operated as follows with reference to FIG. 1 and FIG. 2.

The lifting means 45 have lowered the second mounting plate 43 together with the liquid collector 10 and the second plate 32 (FIG. 2). A wafer W is inserted to the device with close proximity (e.g. distance d1=0.5 mm) to the lower surface of the first plate 31 by a robot end effector (not shown). Gripping pins 35 are closed to securely hold the wafer. Second mounting plate 43 together with the liquid collector 10 and the second plate 32 are lifted (FIG. 1) until the gap G2 between the upper surface of the second plate 32 and the wafer W has the required distance d2 (d2 0.2-3.0 mm). d2 is selected in dependence of the cleaning parameters such as ultrasonic wave length and intensity, fluid flow speed, spin speed of the wafer or specific sound-propagation velocity of the liquid.

The wafer is rotated while a first liquid 11 (e.g. deionized water) is dispensed through tube 21 into gap G1 between the first plate 31 and the wafer W thereby wetting the upper surface of the wafer and totally filling gap G1. Then a second liquid 12 is feed through the lower dispenser 6 into gap G2 between the second plate 32 and the wafer W thereby wetting the lower surface of the wafer and totally filling gap G2. However, gap G2 could be filled with liquid before gap G1 is filled.

After both gaps G1 and G2 are substantially totally filled, ultrasonic sound energy is applied to the second plate 32 by the vibrating elements 4. As can be seen in FIG. 1 the vibrating elements are arranged in a way so that each element 4 covers a ring of the wafers surface when the wafer rotates. Each of these rings overlap each other and therefore substantially the whole surface of the wafer is covered.

To optimize cleaning efficiency d2 can be varied during wet treatment with the lifting means 45. During ultrasonic treatment gripping elements 35 may be opened so that the wafer is freely agitated by ultrasonic waves without being impinged or damped by any element touching the wafer. During the time the gripping elements 35 are open the wafer may only be rotated through the liquid in gap G1, which is rotated by the rotating first plate 31. If distance d1 and d2 are the same the wafer rotates with about half the spin speed as the first plate 31. The lower the distances d1 and d2 are, the higher is the shear rate between the wafer and the plates, which further enhances cleaning efficiency.

After ultrasonic treatment the gripping elements are closed again (if they have been opened) and gas is introduced to the gaps G1 and G2 to displace liquid. To support liquid displacement off the wafer surface, a surface tension lowering agent such as isopropyl alcohol vapor (IPA-vapor) may be added to the gas. Spin speed is raised up to 3000 rpm to spin off any liquid residues. Finally the device is opened again (FIG. 2) and a robot end effector picks the wafer.

Figure 3:
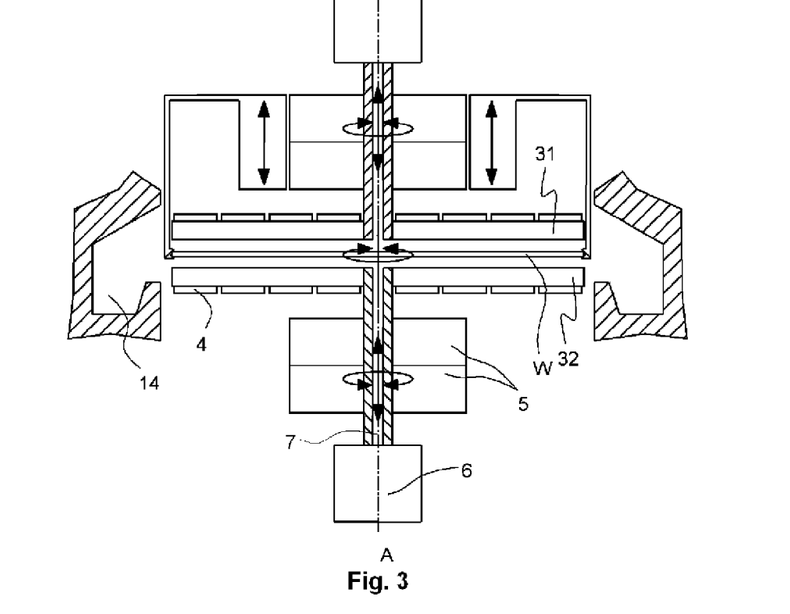
FIG. 3 shows a schematic cross section of a second embodiment of the invention.

FIG. 3 shows a second embodiment of the invention, which differs to the first embodiment as follows. The first plate 31 and the gripping means 35 separated from each other and are connected to separate lifting and rotating means. Thus wafer W can be rotated against first plate 31 when securely held by gripping means 35. Second plate 32 can be independently rotated and lifted and is not connected to liquid collector 10. In this embodiment both the first and the second plate 31, 32 carry ultrasonic vibrating elements 4. The vibrating elements of the first plate 31 and those of the second plate can be agitated alternatively to avoid unwanted interferences, which would occur if the vibrating elements of both plates apply ultrasonic wave energy to the wafer.

Figure 4:
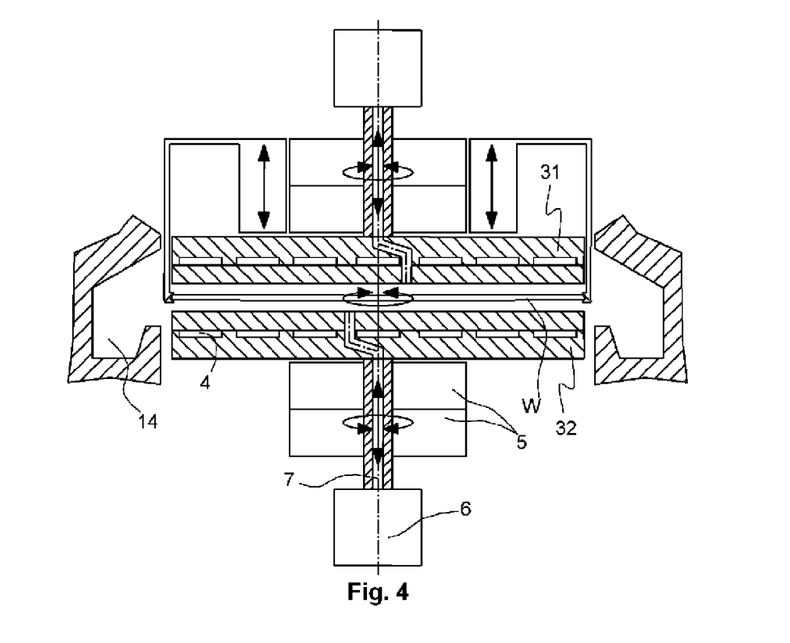
FIG. 4 shows a schematic cross section of a third embodiment of the invention.

The third embodiment according to FIG. 4 differs from the second embodiment by the place of liquid insertion. The openings in the first plate 31 and the second plate 31 for liquid insertion are set off the axis A.

Figure 5:
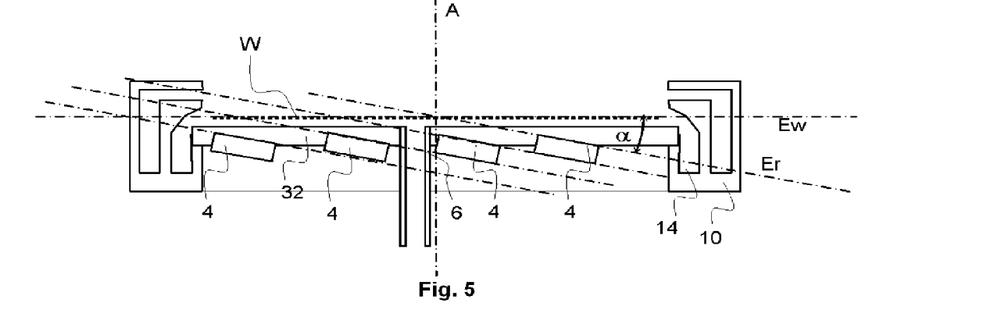
FIG. 5 shows a schematic cross section of a part of the fourth embodiment of the invention.

FIG. 5 shows a schematic cross section of the part of the fourth embodiment, which is a modified first embodiment (FIG. 1, 2). All parts not shown in FIG. 5 are as described with reference to FIGS. 1 and 2. Attached to the second plate 32 are vibrating elements 4, which are arranged in slanted planes Er taking an angle α of about 12° to the plane Ew provided for the wafer. Vibrating elements 4 are acoustically coupled to plate 32. The acoustically coupling can be done directly by the way of gluing or welding the vibrator's resonator to the plate or can be done indirectly by using an intermediate medium such as oil or water.

If the vibrating elements are indirectly coupled to the plate 32 and the intermediate medium has the same sound-propagating velocity as the treatment liquid the necessary angle $\alpha_1$, at which the transducer shall be slanted, with respect to a desired angle $\alpha_2$, which the ultrasonic wave front shall take with the wafer, are the same ($\alpha_1 = \alpha_2$). If plate 32 comprises a membrane, which separates the intermediate medium and the treatment liquid, the influence of refraction and/or reflection through the plate may be neglected.

If vibrating elements are directly coupled to the plate 32 the necessary angle $\alpha_1$, at which the transducer shall be slanted, with respect to a desired angle $\alpha_2$, which the ultrasonic wave front shall take with the wafer, depend on sound-propagation velocity of plate 32 itself (e.g. aluminum; $c_1 = 6000$ m/s) and of the treatment liquid (e.g. diluted aqueous solution; $c_2 = 1500$ m/s). This correlation can be calculated as follows $\sin \alpha_1 / \sin \alpha_2 = c_1/c_2$. Therefore for a desired angle $\alpha_2$ of 12.5° the plane of the transducer plate (or the vibrators resonator) shall be slanted by 60°. If transducer plate is slanted by 30° ultrasonic wave is directed to the wafer at an angle α' of 82.8° (α=7.2°). In the example of FIG. 5 $\alpha = \alpha_1 = 12°$, which leads to $\alpha_2 = 3°$.

Figure 6:
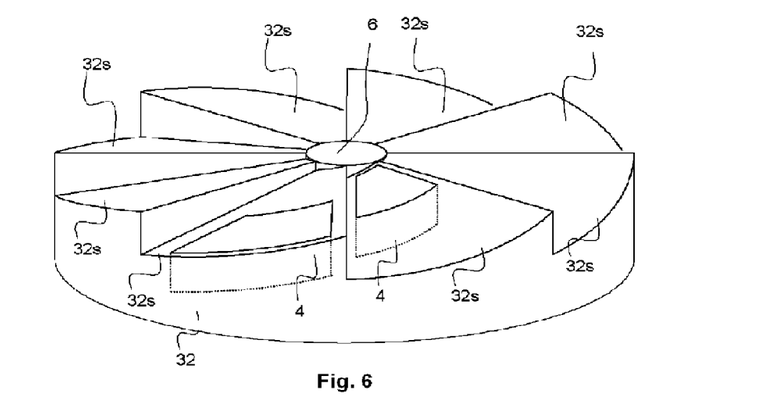
FIG. 6 shows a schematic perspective side view of a part of a fifth embodiment of the invention.

Alternatively (FIG. 6) the second plane 32 carrying the vibrating elements may have a surface facing the wafer comprising sections of slanted planes 32s. Such a plate may than have a surface similar to a flapped disc. The vibrating elements 4 are parallel to the slanted planes 32s. Although only two vibrating elements are shown there may be additional vibrating elements in all other sections.

Figure 7:
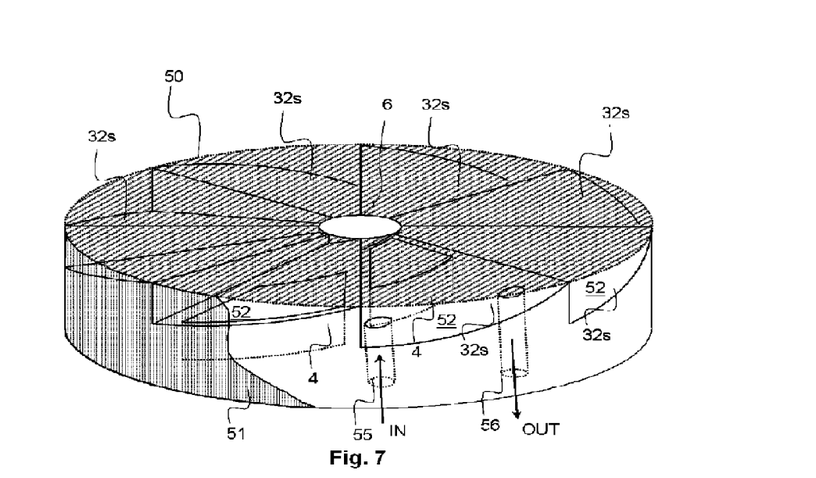
FIG. 7 shows a schematic perspective side view of a part of a sixth embodiment of the invention.

A fifth embodiment shown in FIG. 7 is based on the plate of the forth embodiment. The plate is covered by a membrane 50 and surrounded by a sidewall ring 51. Membrane 50 and sidewall ring 51 are welded together and glued onto transducer plate 32. Thus above each slanted plane 32s an intermediate chamber 52 is formed. The intermediate chambers 52 are filled with sound propagating (ultrasonic transmitting) medium, which can be solid, gel of liquid (e.g. oil or water). Consequently ultrasonic energy generated by vibrating elements 4 (transducers) is indirectly coupled to the membrane 50 and further through the cleaning liquid onto the wafer. If a chamber is filled with a liquid it may be circulated through a cooling circuit (not shown). The cooling liquid (coolant) enters the intermediate chamber 52 through inlet 55 and leaves it through outlet 56. In any case intermediate chambers 52 may be connected with one another or separated from one another.

Figure 8:
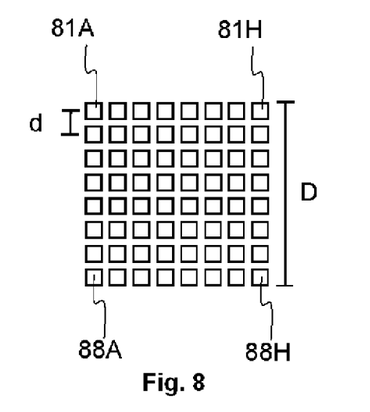
FIG. 8 shows an enlarged view of a two dimensionally arranged array of transducers.

FIG. 8 shows an enlarged view of a two dimensionally arranged array of 64 transducers (a matrix of transducers 81A through 88H), which are used for one aspect of the invention. The mean distance d of the centers of two adjacent transducers is 1 mm whereas the width D of the array of the transducer is about 7.5 mm.

Figure 10:
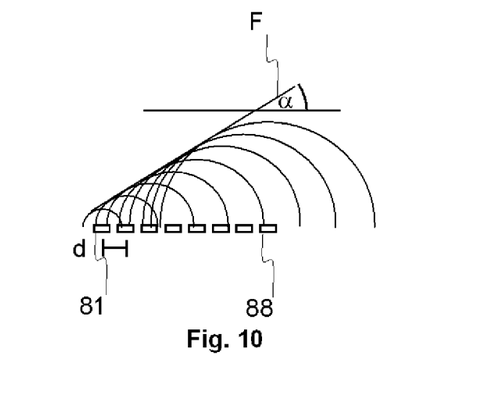
FIG. 10 shows a schematic side view of an array of transducer with an illustration of phase shift.

This array of transducer is agitated by an ultrasonic generator having at least 8 channels to agitate each line (81 through 88) of transducers differently. All transducer lines are agitated with the same frequency and the same amplitude but with different phases. The phase shift φ=1 shall herein be defined as being a phase shift angle of 360°. FIG. 10 illustrates how a phase shift leads to a slanted wave front F. With a first signal the transducer line 88 is agitated then with a phase shift φ transducer line 87 then 86 and so on. The angle α, at which the wave front is slanted to the transducer plate is a function of the wave length λ, the mean distance of the centres of two adjacent transducers d, and the phase shift φ between two adjacent transducers and can be calculated as follows:

$$\sin \alpha = \phi \times \lambda / d$$

Consequently the necessary phase shift for a desired angle is calculated as follows.

$$\phi = (d \times \sin \alpha) / \lambda$$

Wave length λ is a function of sound-propagation velocity c and frequency f (λ=c/f). For megasonic at e.g. f=1.5 MHz) in water at room temperature (25° C.) with c=1.5 km/s the wavelength is 1 mm. For such a wavelength (λ=1 mm), a transducer array with a distance d=0.5 mm and a desired angle α=30° the phase shift φ=0.25 (phase shift angle=90°). For the same medium and desired angle but distance d=1 mm a phase shift of φ=0.5 (phase shift angle=180°) is required. However, in this case a second slanted wave front appears with an angle of α=−30°. If such a second wave front shall be avoided distance d shall be selected not more than half of the wavelength.

Figure 9:
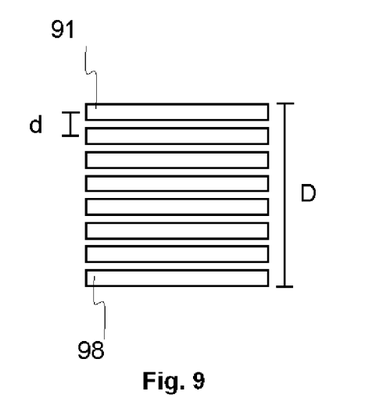
FIG. 9 shows an enlarged view of a one dimensionally arranged array of transducers.

FIG. 9 shows an enlarged view of a one dimensionally arranged array of 8 oblong transducers (91 through 98), which are used for one aspect of the invention. Such an array of oblong transducer covers the same area as the array shown in FIG. 8. In this case each channel of the ultrasonic generator only agitates one transducer of on array.

No matter which kind of array of transducers is used numerous arrays may be arranged in or on a transducer plate of a device for wet treatment of wafers.

FIG. 10 shows a schematic side view of an array of transducer with an illustration of phase shifted wave fronts generating a wave front plane F slanted by angle α.

The invention claimed is:

1. A method for wet treating a single wafer, comprising:
   holding a single wafer in a plane B;
   providing a first plate having a plane A facing the wafer thereby creating a first gap of a distance d1;
   providing a second plate having a plane C facing the wafer thereby creating a second gap of a distance d2;
   inserting a first liquid into said first gap thereby substantially completely filling said first gap;
   inserting a second liquid into said second gap thereby substantially completely filling said second gap;
   applying ultrasonic energy to said second plate while less than 10% of the ultrasonic energy applied to said second plate is applied to said first plate; and
   relatively rotating the wafer and the second plate against each other about a rotation axis substantially perpendicular to main surfaces of the wafer.

2. The method according to claim 1, wherein the wafer is rotating.

3. The method according to claim 1, wherein during term of processing substantially all parts of one wafer side are at least temporarily covered by the second plate.

4. The method according to claim 3, wherein said second liquid is inserted into said second gap through an opening offset to the rotation axis.

5. The method according to claim 1, further comprising:
   applying ultrasonic energy to said first plate so that ultrasonic energy is applied to said plane B in an angle α' of less than 89°; and
   relatively moving the wafer and first plate against each other along a direction substantially parallel to the wafer's main surfaces wherein said ultrasonic energy applied to said first plate so that ultrasonic energy is applied to said plane B in an angle α' of less than 89° is generated by an array of a plurality of transducers with at least one ultrasonic generator to separately agitate said plurality of transducers in a phase-shifted way in order to generate an ultrasonic wave directed from said array of transducers at an angle α' of less than 89°.

6. The method according to claim 1, further comprising:
   applying ultrasonic energy to said first plate so that ultrasonic energy is applied to said plane B in an angle α' of less than 89°; and
   relatively moving said wafer and said first plate against each other along a direction substantially parallel to the wafer's main surfaces wherein said relative movement of said wafer and said first plate against each other along the direction substantially parallel to the wafer's main surfaces is carried out by relatively rotating said wafer and the second plate against each other about a rotation axis substantially perpendicular to the wafer's main surfaces.

7. The method according to claim 5, wherein during a term of processing substantially all parts of one wafer side are at least temporarily covered by the second plate.

8. The method according to claim 5, wherein angle α' is varied during the wafer being treated with liquid.

\* \* \* \* \*